United States Patent
Ramasahayam et al.

(10) Patent No.: US 11,508,421 B2
(45) Date of Patent: Nov. 22, 2022

(54) ELECTRONIC DEVICES COMPRISING AIR GAPS ADJACENT TO BITLINES AND RELATED METHODS AND SYSTEMS

(71) Applicant: Micron Technology, Inc., Boise, ID (US)

(72) Inventors: Mithun Kumar Ramasahayam, Merdian, ID (US); Michael J. Gossman, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/097,494

(22) Filed: Nov. 13, 2020

(65) Prior Publication Data
US 2022/0157354 A1   May 19, 2022

(51) Int. Cl.
| | |
|---|---|
| *G11C 7/18* | (2006.01) |
| *H01L 29/06* | (2006.01) |
| *H01L 27/11551* | (2017.01) |
| *H01L 27/11524* | (2017.01) |

(52) U.S. Cl.
CPC .......... *G11C 7/18* (2013.01); *H01L 27/11551* (2013.01); *H01L 29/0649* (2013.01); *H01L 27/11524* (2013.01)

(58) Field of Classification Search
CPC ........... H01L 27/11551; H01L 29/0649; H01L 27/1157; H01L 23/528; H01L 27/11524; G11C 7/18; H01K 21/76802
USPC .......................................... 257/334; 438/270
See application file for complete search history.

(56) References Cited

U.S. PATENT DOCUMENTS

| | | | |
|---|---|---|---|
| 6,773,553 B2 | 8/2004 | Hyvonen et al. | |
| 7,579,221 B1 * | 8/2009 | Ditzel et al. | ........ H01L 27/0207 |
| | | | 418/149 |
| 9,401,305 B2 | 7/2016 | Takahashi et al. | |
| 9,524,904 B2 | 12/2016 | Ohori et al. | |
| 9,748,332 B1 | 8/2017 | Yang et al. | |
| 10,438,892 B2 | 10/2019 | Morita | |
| 2012/0126306 A1 | 5/2012 | Kawaguchi et al. | |
| 2013/0207267 A1 | 8/2013 | Rho | |
| 2014/0015034 A1 | 1/2014 | Ryu et al. | |
| 2015/0228582 A1 | 8/2015 | Sel et al. | |
| 2016/0027727 A1 | 1/2016 | Kim et al. | |
| 2019/0067080 A1 | 2/2019 | Chiu et al. | |

FOREIGN PATENT DOCUMENTS

KR    10-2017-0025859 A    3/2017

OTHER PUBLICATIONS

International Search Report for Application No. PCT/US2021/053810, dated Jan. 21, 2022, 3 pages.
Written Opinion of the International Searching Authority for Application No. PCT/US2021/053810, dated Jan. 21, 2022, 6 pages.

(Continued)

*Primary Examiner* — Thinh T Nguyen
(74) *Attorney, Agent, or Firm* — TraskBritt

(57) ABSTRACT

An electronic device that comprises bitlines and air gaps adjacent to an array region of an electronic device is disclosed. The bitlines comprise sloped sidewalls and a height of the air gaps is greater than a height of the bitlines. Additional electronic devices are disclosed, as are methods of forming an electronic device and related systems.

26 Claims, 4 Drawing Sheets

(56) References Cited

OTHER PUBLICATIONS

Gupta et al., U.S. Appl. No. 16/990,463 titled Methods of Forming Apparatuses Including Air Gaps Between Conductive Lines and Related Apparatuses, Memory Devices, and Electronic Systems filed Aug. 11, 2020.
Hopkins et al., U.S. Appl. No. 16/990,518 titled Microelectronic Devices Including Conductive Structures, and Related Memory Devices, Electronic Systems, and Methods filed Aug. 11, 2020.

* cited by examiner

ELECTRONIC DEVICES COMPRISING AIR GAPS ADJACENT TO BITLINES AND RELATED METHODS AND SYSTEMS

TECHNICAL FIELD

Embodiments disclosed herein relate to electronic devices and electronic device fabrication. More particularly, embodiments of the disclosure relate to electronic devices comprising air gaps adjacent to bitlines, the air gaps exhibiting a greater height than a height of the bitlines and the bitlines having sloped sidewalls, and to related methods and systems.

BACKGROUND

Electronic device designers often desire to increase the level of integration or density of features (e.g., components) within an electronic device by reducing the dimensions of the individual features and by reducing the separation distance between neighboring features. Electronic device designers also desire to design architectures that are not only compact, but offer performance advantages, as well as simplified designs. Reducing the dimensions and spacing of features of the electronic devices has placed increasing demands on the methods used to form the electronic devices. One solution has been to form three-dimensional (3D) electronic devices, such as 3D NAND memory devices, in which memory cells are stacked vertically on a substrate. The electronic devices include access lines (e.g., wordlines) and data lines (e.g., bitlines) operably coupled to the memory cells. However, as the bitlines of the electronic devices are formed closer together and at smaller dimensions, the capacitive coupling between adjacent bitlines increases. Air gaps have been formed between adjacent bitlines to reduce bitline to bitline coupling.

DETAILED DESCRIPTION

Figure 1:
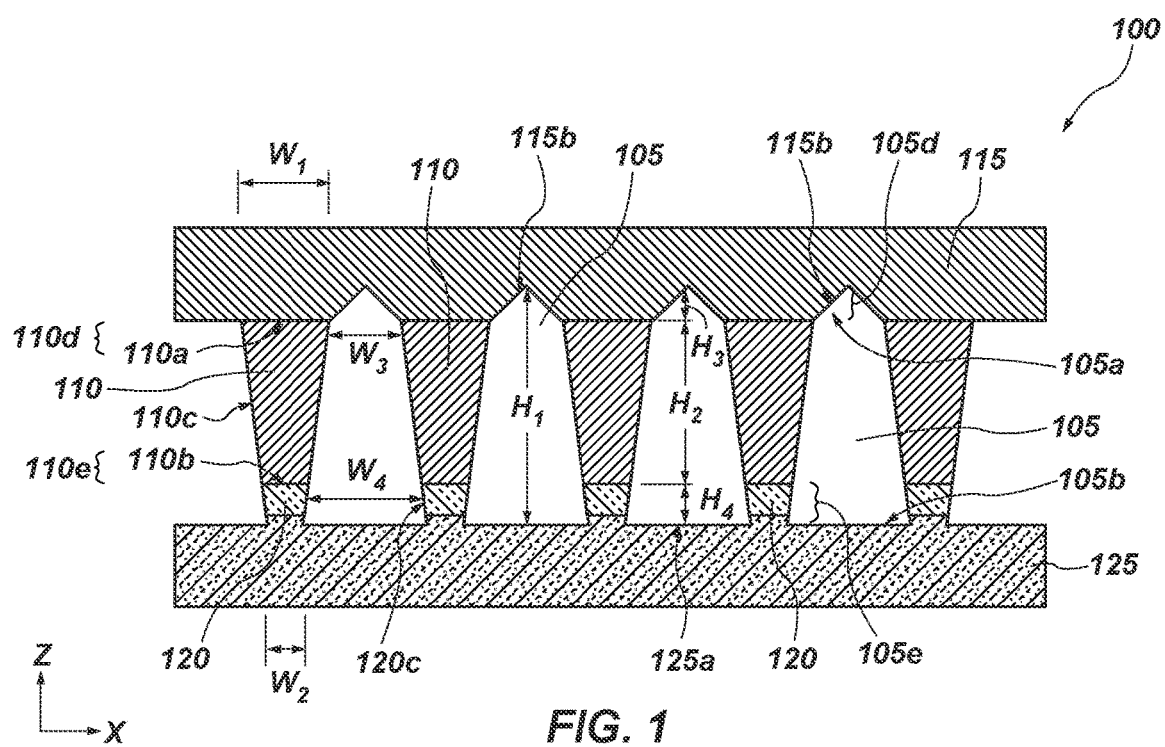
FIGS. 1 and 2 are cross-sectional views of an electronic device including bitlines and air gaps according to embodiments of the disclosure.

An electronic device that includes air gaps between adjacent bitlines is disclosed. A portion of the air gaps extends a distance above an upper surface of the bitlines. A portion of the air gaps may optionally extend a distance below a bottom surface of the bitlines. A height of the air gaps is greater than a height of the bitlines. The air gaps separate adjacent bitlines from one another. The air gaps and the bitlines also exhibit sloped (e.g., tapered) sidewalls, with a width at an upper portion of the bitlines greater than a width at a lower portion of the bitlines. Since the air gaps are taller than the bitlines, reduced capacitance (e.g., bitline-bitline capacitance) is achieved between the adjacent bitlines. An upper portion of the air gaps, such as the distance to which the air gaps extend above the upper surface of the bitlines, provides a substantially pentagonal cross-sectional shape to the air gaps. The upper portion of the air gaps according to embodiments of the disclosure provides additional volume relative to the volume of air gaps in conventional electronic devices, which include bitlines with vertical sidewalls. The air gaps are wider (e.g., exhibit a greater width) than the bitlines at a corresponding location. During formation of the electronic device containing the air gaps and the bitlines, the greater width of the upper portion of the bitlines and the sloped sidewalls of the bitlines enable the air gaps to extend above the height of the bitlines. One or more of the electronic devices according to embodiments of the disclosure is present in an apparatus (e.g., a semiconductor device, a memory device).

The reduced bitline-bitline capacitance is achieved without adding complex process acts to the formation of the electronic device. The reduced capacitance between the adjacent bitlines improves electrical performance of the electronic device, such as decreasing programming time and increasing processing speed. The improved electrical performance is achieved while maintaining the resistance of the electronic device, along with maintaining small dimensions of the bitlines compared to conventional electronic devices that include bitlines with vertical sidewalls.

The following description provides specific details, such as material types, material thicknesses, and process conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of an electronic device or a complete process flow for manufacturing the electronic device and the structures described below do not form a complete electronic device. Only those process acts and structures necessary to understand the embodiments described herein are described in detail below. Additional acts to form a complete electronic device may be performed by conventional techniques.

Unless otherwise indicated, the materials described herein may be formed by conventional techniques including, but not limited to, spin coating, blanket coating, chemical vapor deposition (CVD), atomic layer deposition (ALD), plasma enhanced ALD, physical vapor deposition (PVD) (including sputtering, evaporation, ionized PVD, and/or plasma-enhanced CVD), or epitaxial growth. Alternatively, the materials may be grown in situ. Depending on the specific material to be formed, the technique for depositing or growing the material may be selected by a person of ordinary skill in the art. The removal of materials may be accomplished by any suitable technique including, but not limited to, etching (e.g., dry etching, wet etching, vapor etching), ion milling, abrasive planarization (e.g., chemical-mechanical planarization), or other known methods unless the context indicates otherwise.

Drawings presented herein are for illustrative purposes only, and are not meant to be actual views of any particular material, component, structure, electronic device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing.

For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, the term "air gap" means and includes a void between adjacent structures or features. The void is not necessarily devoid of a material within its boundaries and may, for example, contain a gaseous species, such as air or an inert gas, or a vacuum.

As used herein, "and/or" includes any and all combinations of one or more of the associated listed items.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the term "electronic device" includes, without limitation, a memory device, as well as semiconductor devices which may or may not incorporate memory, such as a logic device, a processor device, or a radiofrequency (RF) device. Further, an electronic device may incorporate memory in addition to other functions such as, for example, a so-called "system on a chip" (SoC) including a processor and memory, or an electronic device including logic and memory. The electronic device may, for example, be a 3D electronic device, such as a 3D NAND Flash memory device.

As used herein, reference to an element as being "on" or "over" another element means and includes the element being directly on top of, adjacent to (e.g., laterally adjacent to, vertically adjacent to), underneath, or in direct contact with the other element. It also includes the element being indirectly on top of, adjacent to (e.g., laterally adjacent to, vertically adjacent to), underneath, or near the other element, with other elements present therebetween. In contrast, when an element is referred to as being "directly on" or "directly adjacent to" another element, no intervening elements are present.

As used herein, the term "selectively etchable" means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a material (e.g., a base material) or construction upon which additional materials are formed. The substrate may be a an electronic substrate, a semiconductor substrate, a base semiconductor layer on a supporting structure, an electrode, an electronic substrate having one or more materials, layers, structures, or regions formed thereon, or a semiconductor substrate having one or more materials, layers, structures, or regions formed thereon. The materials on the electronic substrate or semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein, the terms "pentagon" or "pentagonal" mean and include a shape having five sides. While the sides of the pentagon may be substantially linear, in some embodiments an upper surface of the pentagon may be arcuate (e.g., curved), forming a somewhat trapezoidal cross-sectional shape.

As used herein, the terms "vertical," "longitudinal," "horizontal," and "lateral" are in reference to a major plane of a structure and are not necessarily defined by Earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

An electronic device 100 according to embodiments of the disclosure includes air gaps 105 and bitlines 110 as shown in FIG. 1. The air gaps 105 are adjacent to the bitlines 110 and extend a distance above the bitlines 110 and, optionally, below the bitlines 110. The air gaps 105 exhibit a substantially pentagonal cross-sectional shape. In FIG. 1, the air gaps 105 and the bitlines 110 extend in an x-z direction that extends substantially parallel to a major surface of a base material (not shown) that supports the air gaps 105 and the bitlines 110. The air gaps 105 are laterally adjacent to the bitlines 110 and upper surfaces 105a of the air gaps 105 extend above upper surfaces 110a of the bitlines 110. Lower surfaces 105b of the air gaps 105 may optionally extend below lower surfaces 110b of the bitlines 110. The bitlines 110 include sloped sidewalls 110c. A height $H_1$ of the air gaps 105 is greater than a height $H_2$ of the bitlines 110. An upper portion 105d of the air gaps 105 extends a height $H_3$ in the vertical direction above the upper surfaces 110a of the bitlines 110. A lower portion 105e of the air gaps 105 extends a height $H_4$ in the vertical direction below the lower surfaces 110b of the bitlines 110.

The air gaps 105 are defined by an oxide material 115, the sloped sidewalls 110c of the bitlines 110, sidewalls 120c of a first stack material 120 of a stack 140 (see FIGS. 3 and 4), and an array region 125. For example, the air gaps 105 are defined by a lower surface 115b of the oxide material 115, the sloped sidewalls 110c of the bitlines 110, the sloped sidewalls 120c of the first stack material 120 below the bitlines 110, and an upper surface 125a of the array region 125. The array region 125 of the electronic device 100 is adjacent to (e.g., below) the bitlines 110 and the air gaps 105. The array region 125 is adjacent to (e.g., over, on) the base material. A portion of the stack 140 separates the bitlines 110 from the array region 125. The air gaps 105 are continuous in that the height $H_1$ continuously extends in a vertical direction from the upper surface 125a of the array region 125 to the lower surface 115b of the oxide material 115. Therefore, laterally adjacent bitlines 110 are separated from one another by the air gaps 105 that continuously extend in the vertical direction above and below the upper surfaces 110a and the lower surfaces 110b of the bitlines 110. The upper portion 105d of the air gaps 105 exhibits a substantially triangular cross-sectional shape or a substantially semi-circular cross-sectional shape, in contrast to conventional electronic devices, which exhibit a substantially rectangular cross-sectional shape. Since the lower surface 115b of the oxide material 115 is not vertical, the upper portion 105d of the air gaps 105 according to embodiments of the disclosure is not rectangular in its cross-sectional shape.

The sidewalls 110c of the bitlines 110 are sloped (e.g., tapered), resulting in the air gaps 105 defined by the sidewalls 110c of the bitlines 110 being sloped (e.g., tapered). A width $W_1$ of the upper portion 110d of the bitlines 110 is greater than a width $W_2$ of the lower portion 110e of the bitlines 110. The width $W_2$ of the lower portion 110e of the bitlines 110 may correspond to a desired critical dimension (CD) of the bitlines 110 for electrical coupling (e.g., electrical connection) to underlying conductive structures (not shown) in the array region 125, such as to underlying contacts. Since the CD of the lower portion 110e of the bitlines 110 is less than the CD of the upper portion 110d of the bitlines 110, the bitlines 110 may land on (e.g., contact) the underlying conductive structures without increasing the complexity of the process of forming the electronic device 100. The sloped sidewalls 110c of the bitlines 110, therefore, enable the bitlines 110 to be easily operably coupled (e.g., electrically coupled) to the conductive structures in the array region 125. A width $W_3$ of the upper portions 105d of the air gaps 105 (e.g., the width between adjacent upper portions 110d of the bitlines 110) is less than a width $W_4$ of the lower portions 105e of the air gaps 105 (e.g., the width between adjacent lower portions 110e of the bitlines 110). Since the sidewalls 110c of the bitlines 110 are sloped and the lower surface 115b of the oxide material 115 is not vertical, dimensions (e.g., heights, widths) of the bitlines 110 and air gaps 105 vary depending on the location within the bitlines 110 or the air gaps 105. Relative widths of the bitlines 110 and air gaps 105 refer to the width at a similar (e.g., corresponding) location. By way of example only, the relative widths $W_3$, $W_4$ of the air gaps 105 and $W_1$, $W_2$ of the bitlines 110 are at similar locations in the z direction.

The height $H_1$ refers to the maximum distance between the upper surface 125a of the array region 125 and the lower surface 115b of the oxide material 115. The height $H_2$ refers to the distance between the upper surface 110a of the bitlines 110 and the lower surface 110b of the bitlines 110. The distance to which the upper portion 105d of the air gaps 105 extends above the upper surfaces 110a of the bitlines 110 (e.g., above a plane coplanar with the upper surfaces 110a of the bitlines 110) may vary since the lower surface 115b of the oxide material 115 is not substantially vertical. The height $H_3$ refers to the maximum distance between the plane coplanar with the upper surfaces 110a of the bitlines 110 and the lower surface 115b of the oxide material 115 in a directly vertical direction. The height $H_4$ is the distance between the upper surface 125a of the array region 125 and a plane coplanar with the lower surface 110b of the bitlines 110.

Figure 2:
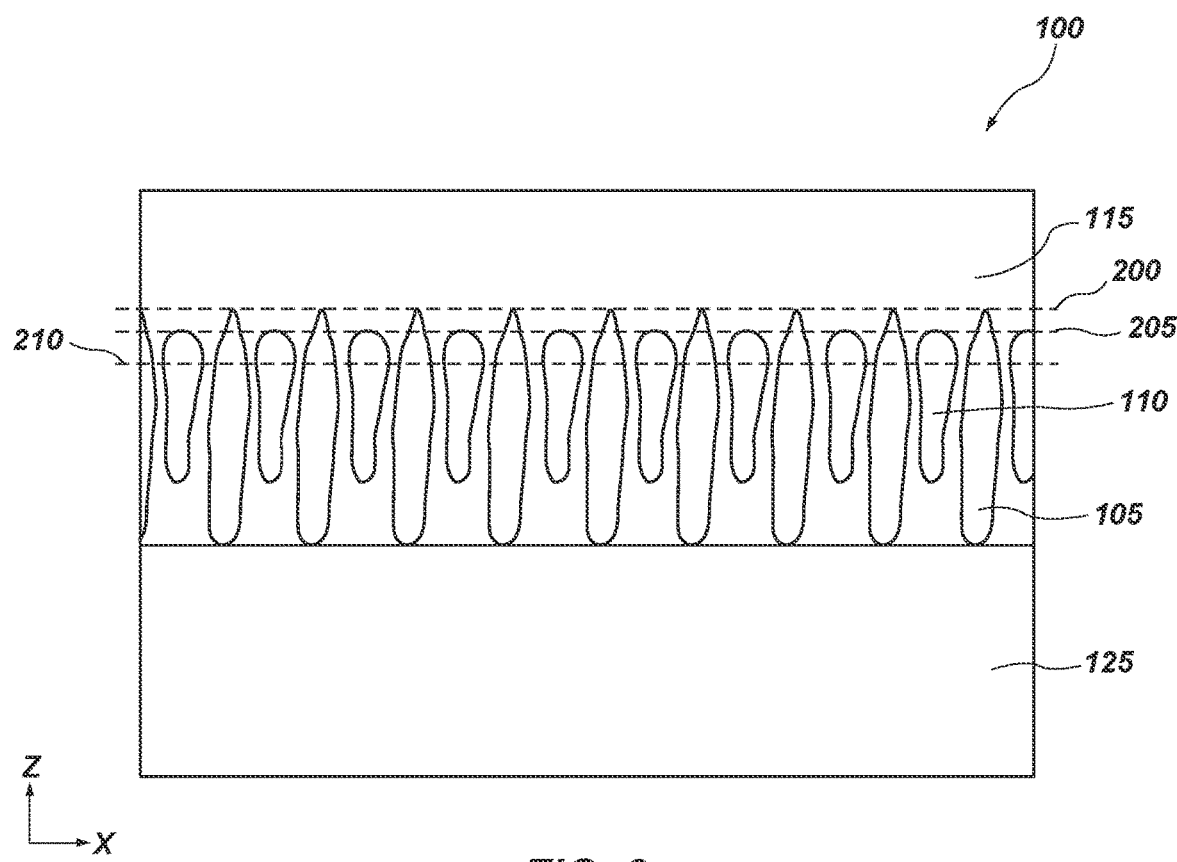

The air gaps 105 exhibit a substantially pentagonal cross-sectional shape in the x-z direction, with the upper portion 105d of the air gaps 105 exhibiting the substantially triangular cross-sectional shape and the lower portion 105e of the air gaps 105 exhibiting a substantially quadrilateral cross-sectional shape. While FIGS. 1 and 2 show the upper portion 105d of the air gaps 105 as being substantially triangular in cross-sectional shape, the lower surface 115b of the oxide material 115 may exhibit a rounded shape (e.g., an arcuate shape) such that the upper portion 105d of the air gaps 105 exhibits a semi-circular cross-sectional shape. The cross-sectional shape of the upper portion 105d of the air gaps 105 may, therefore, be substantially triangular or substantially semi-circular. By adjusting the height $H_3$ and the cross-sectional shape of the upper portion 105d of the air gaps 105, desired electrical performance properties of the electronic device 100 may be achieved. The cross-sectional shape of the lower portion 105e of the air gaps 105 may be quadrilateral, such as being substantially trapezoidal or substantially rectangular, depending on the slope of the sidewalls 120c of the first stack material 120.

The bitlines 110 are laterally separated from one another (e.g., in the x direction) by the air gaps 105, with the air gaps 105 directly contacting the bitlines 110. The bitlines 110 are separated from the array region 125 (e.g., in the z direction) by a portion of the stack 140, such as by the first stack material 120. For example, a portion of the first stack material 120 may intervene between the bitlines 110 and the array region 125. The array region 125 is indicated in FIGS. 1 and 2 as being a single material for convenience. However, the array region 125 includes one or more component(s) of the electronic device 100, such as one or more wordlines, one or more tiers of alternating dielectric materials and conductive materials, one or more memory cells, one or more pillars (e.g., memory pillars), one or more staircase structures, one or more contacts, etc., depending on a desired function of the apparatus containing the one or more of the electronic devices 100 according to embodiments of the disclosure. The components of the array region 125 may be formed by conventional techniques.

Accordingly, an electronic device that comprises bitlines and air gaps adjacent to an array region of an electronic device is disclosed. The bitlines comprise sloped sidewalls and a height of the air gaps is greater than a height of the bitlines.

Accordingly, another electronic device is disclosed and comprises a pattern of bitlines and air gaps adjacent to an array region of an electronic device. The air gaps are defined by an oxide material overlying the bitlines and air gaps, sloped sidewalls of laterally adjacent bitlines, and an upper surface of the array region. The air gaps extend a distance above the bitlines.

As shown in FIG. 2, the electronic device 100 according to embodiments of the disclosure includes the air gaps 105 and bitlines 110, with a height of the air gaps 105 indicated by line 200. The air gaps 105 extend above the bitlines 110, the height of which is indicated by line 205. For comparison, a height of air gaps of conventional electronic devices is indicated by line 210. The height of the air gaps 105 according to embodiments of the disclosure is greater than the height of the bitlines 110.

Figure 3:
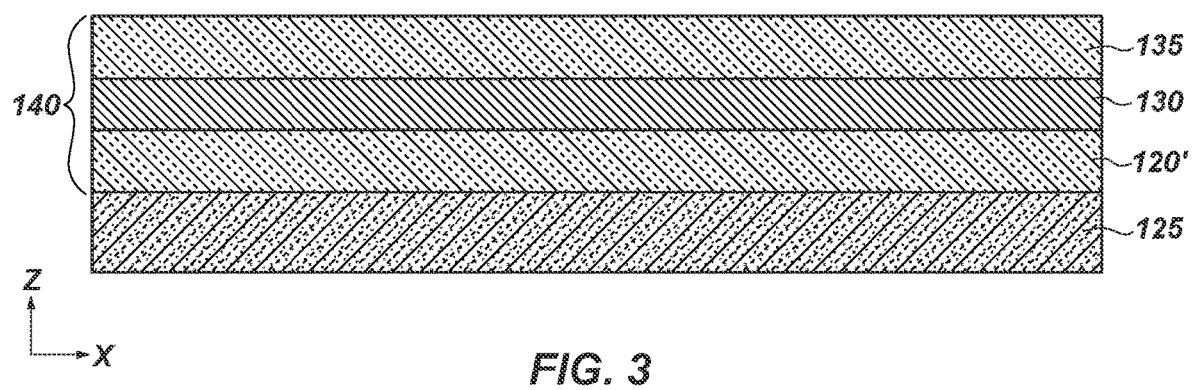
FIGS. 3-6 are cross-sectional views that illustrate forming the electronic device of FIG. 1 according to embodiments of the disclosure.

The electronic device 100 of FIGS. 1 and 2 may be formed as shown in FIGS. 3-6, which are cross-sectional views of the electronic device 100 during fabrication. As shown in FIG. 3, the first stack material 120' is formed adjacent to (e.g., over) the array region 125, which is formed adjacent to (e.g., over) the base material (not shown). A second stack material 130 is formed over the first stack material 120' and a third stack material 135 is formed over the second stack material 130. The first stack material 120', the second stack material 130, and the third stack material 135 form the stack 140 of materials into which the bitlines 110 are subsequently formed. The first stack material 120', the second stack material 130, and the third stack material 135 may, for example, be dielectric materials. By way of example only, the first stack material 120' may be a first nitride material, the second stack material 130 may be an oxide material, and the third stack material 135 may be a second nitride material. The first nitride material and the second nitride material may independently be silicon nitride, silicon oxynitride, or a combination thereof and the oxide material may be silicon oxide. In some embodiments, the first stack material 120' is silicon nitride, the second stack material 130 is silicon oxide, and the third stack material 135 is silicon nitride. While the stack 140 is described and illustrated herein as including multiple materials (e.g., two or more materials, three or more materials), the stack 140 may be formed of a single material in which a desired sidewall profile may be achieved, such as the sloped sidewalls 140c of the stack 140. The one or more materials of the stack 140 may be selected to be selectively etchable relative to a material of the bitlines 110.

Each of the first stack material 120', the second stack material 130, and the third stack material 135 may be formed by conventional techniques. The first stack material 120', the second stack material 130, and the third stack material 135 may be independently formed to a desired thickness, such as a thickness of from about 200 Å to about 1000 Å. A total thickness to which the first stack material 120', the second stack material 130, and the third stack material 135 are formed may depend on desired dimensions (e.g., height $H_2$) of the bitlines 110. In some embodiments, each of the first stack material 120', the second stack material 130, and the third stack material 135 are formed at a thickness of about 400 Å.

Figure 4:
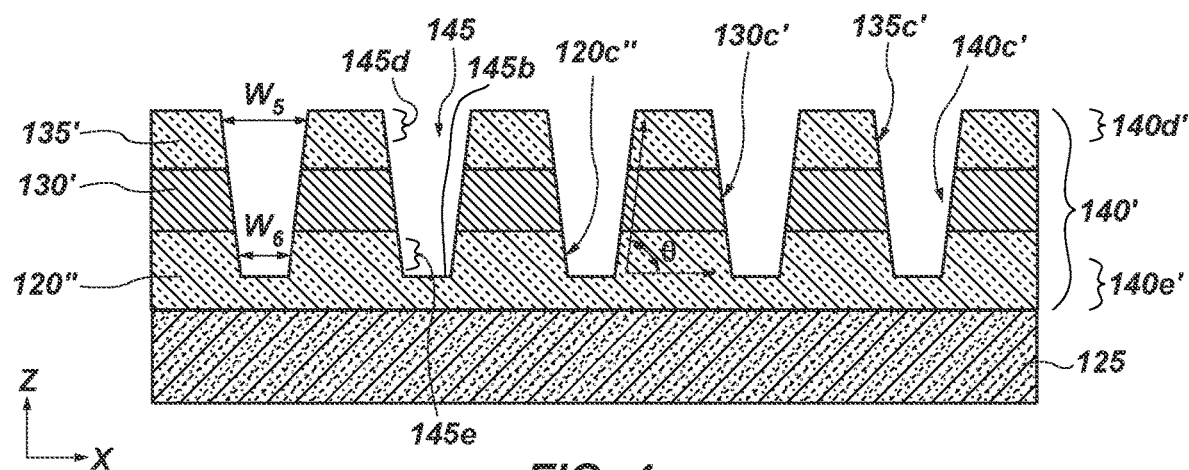

Portions of the stack 140 are removed, as shown in FIG. 4, to form openings 145 and patterned stack 140'. The openings 145 may be formed by conventional techniques, such as conventional photolithography techniques. The openings 145 extend through the second stack material 130 and the third stack material 135 and into the first stack material 120'. A portion 120 of the first stack material 120' remains below the openings 145, separating the openings 145 from the array region 125. The openings 145 are defined by sidewalls 140c' of the patterned stack 140' and an upper surface of the patterned first stack material 120". The openings 145 correspond to locations where the material of the bitlines 110 is ultimately formed. The sidewalls 140c' of the patterned stack 140' are sloped and correspond to a desired etch profile of the openings 145.

One or more etch processes may be conducted to form the openings 145 and the patterned stack 140'. For example, a single etch process may be used to form the openings 145. Alternatively, a first etch process may be used to remove the portions of the third stack material 135 and the second stack material 130 and a second etch process may be used to remove the portions of the first stack material 120'. Alternatively, a first etch process may be used to remove portions of the first stack material 120' before forming the second stack material 130 and the third stack material 135 adjacent to the first stack material 120'. After forming the second stack material 130 and the third stack material 135, a second etch process may be conducted to remove the portions of the second stack material 130 and the third stack material 135. In some embodiments, the openings 145 are formed by a dry etch process. Conventional etch chemistries (e.g., etch gases) are used to form the openings 145 and may be selected based on the materials used for the first stack material 120', the second stack material 130, and the third stack material 135. The etch chemistries (e.g., etch gases) may be fluorine-based or chlorine-based chemistries including, but not limited to, one or more of $CF_4$, $CHF_3$, $C_2F_6$, $CCl_4$, $Cl_2$, $NF_3$, or $SF_6$.

The portions of the first stack material 120', the second stack material 130, and the third stack material 135 are removed by an etch process, such as by a dry plasma etch process, to form a patterned first stack material 120", a patterned second stack material 130', and a patterned third stack material 135'. Sidewalls 120c", 130c', and 135c' of the patterned first stack material 120", the patterned second stack material 130' and the patterned third stack material 135' are aligned with one another to form the openings 145 in the stack 140. The remaining portions of the patterned first stack material 120", the patterned second stack material 130', and the patterned third stack material 135' may exhibit sloped sidewalls 120c", 130c', 135c' (e.g., tapered sidewalls), with the openings 145 forming the pattern in the stack 140 (e.g., the patterned stack 140'). The sloped sidewalls 140c' of the patterned stack 140' define the sidewalls of the openings 145. A width $W_5$ of an upper portion 145d of the openings 145 is greater than a width $W_6$ of a lower portion 145e of the openings 145. In other words, the upper portion 140d of the patterned stack 140' is narrower than the lower portion 140e of the patterned stack 140'. While FIG. 4 illustrates the sidewalls 140c' of the stack 140 as exhibiting a substantially linear slope, the slope of the sidewalls 135c' of the patterned third stack material 135' may be greater than the slope of the sidewalls 120c", 130c' of the patterned first stack material 120" or the patterned second stack material 130'. For instance, the slope of the sidewalls 130c', 135c' of the patterned second stack material 130' and the patterned third stack material 135' may be greater than the slope of the sidewalls 120c" of the patterned first stack material 120". Alternatively, the sidewalls 130c', 135c' of the patterned second stack material 130' and the patterned third stack material 135' may be sloped while the sidewalls 120c" of the patterned first stack material 120" may be vertical or substantially vertical. Alternatively, the sidewalls 135c' of the patterned third stack material 135' may be sloped while the sidewalls 120c", 130c' of the patterned first stack material 120" and the patterned second stack material 130' may be vertical or substantially vertical. An angle θ defined by an intersection between a vector parallel to the sloped sidewalls 140c' of the patterned stack 140' and a vector parallel to a lower surface 145b of the openings 145 may be less than about 90 degrees. By way of example only, a pattern of the openings 145 and the patterned stack 140' may be formed by a dual damascene process, such as by using a pitch quadrupling process.

Figure 5:
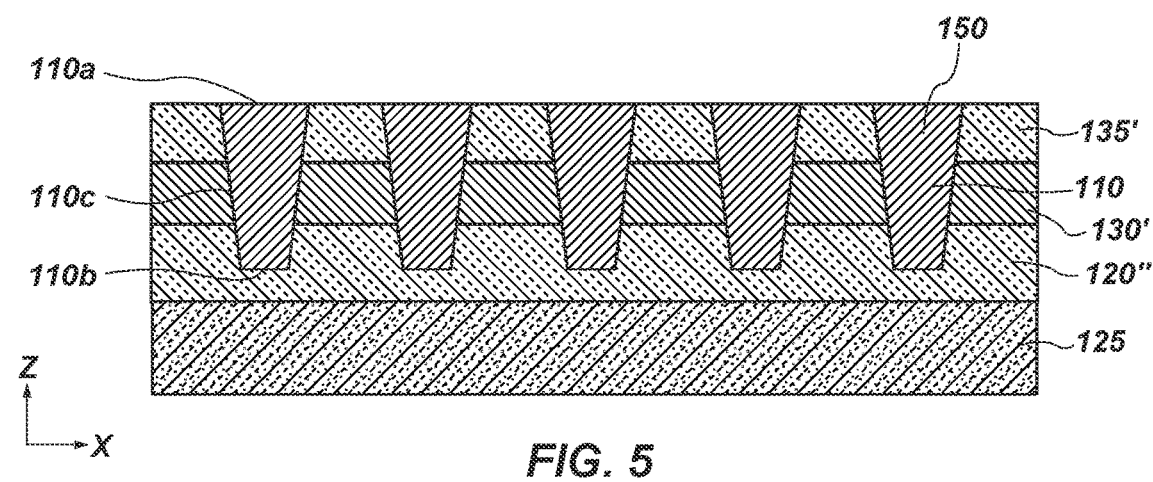

A conductive material 150 is formed in the openings 145 to form the bitlines 110, as shown in FIG. 5. Excess conductive material formed over the patterned stack 140' may be removed by conventional techniques, such as by abrasive planarization (e.g., chemical-mechanical planarization (CMP)). The patterned third stack material 135' may, for example, function as an etch stop layer during the CMP of the conductive material 150. The conductive material 150 may be an electrically conductive material, such as a conductively-doped semiconductor material, undoped polysilicon, or a metal. The conductively-doped semiconductor material may include n-doped polysilicon, p-doped polysilicon, a conductively-doped germanium (Ge) material, or a conductively-doped silicon germanium (SiGe) material. The metal may be an elemental metal, such as tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al), or an alloy thereof. Alternatively, the metal may be a metal-containing compound, such as a metal nitride, a metal silicide, a metal carbide, or a metal oxide. In some embodiments, the conductive material 150 is tungsten.

Since the upper portions 145d of the openings 145 are wider than the lower portions 145e of the openings 145 and since the sidewalls 140c' of the patterned stack 140' are sloped, the conductive material 150 may be formed in the openings 145 without voids or seams forming in the bitlines 110. The conductive material 150 substantially completely fills the openings 145 to form the bitlines 110, with the upper portion 110d of the bitlines 110 being wider than the lower portion 110e of the bitlines 110. Therefore, the resulting bitlines 110 are substantially free of voids and seams even though the bitlines 110 may exhibit small dimensions and be more closely spaced to one another than the bitlines of conventional electronic devices. The upper portion 140d' of the patterned stack 140' is narrower than the lower portion 140e' of the patterned stack 140'.

Figure 6:
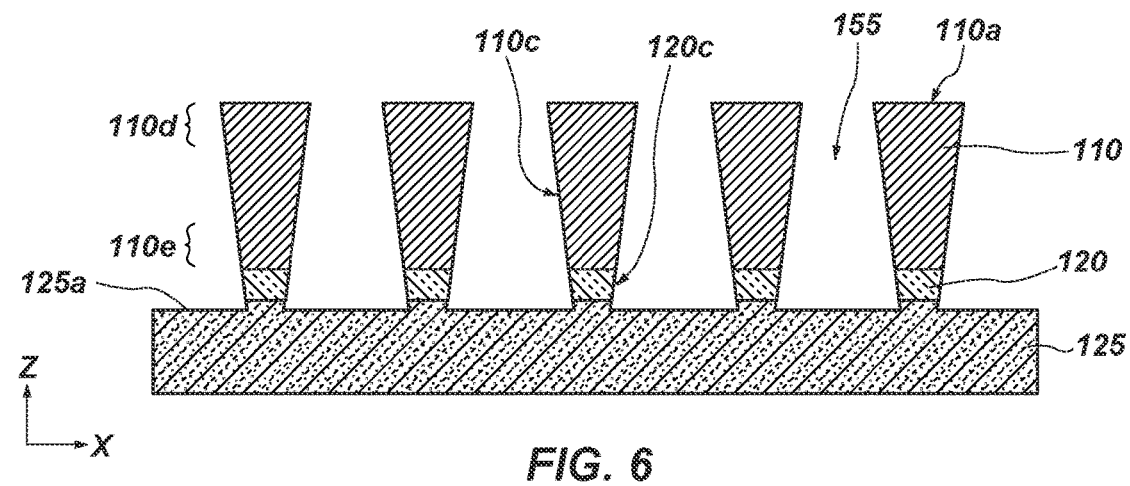

The patterned stack 140' is then removed (e.g., etched), as shown in FIG. 6, to form a pattern of the bitlines 110 and spaces 155. The bitlines 110 are separated (e.g., spaced apart) from one another in the x direction by the spaces 155. The patterned second stack material 130' and the patterned third stack material 135' may be substantially removed, while only a portion of the patterned first stack material 120" is removed. The desired portions of the patterned stack 140' are removed without substantially removing the conductive material 150 of the bitlines 110. In other words, the conductive material 150 of the bitlines 110 is not substantially removed (e.g., consumed) by the etch chemistry and etch conditions used to remove the patterned stack 140'. Since the bitlines 110 extend into, but not through, the patterned first stack material 120", the first stack material 120 of the patterned first stack material 120" adjacent to (e.g., below) the bitlines 110 remains between the array region 125 and the bitlines 110. The first stack material 120 separates the array region 125 from the bitlines 110. While not illustrated in FIG. 6, the first stack material 120 of the patterned first stack material 120" may optionally surround a portion of the lower portions 110e of the bitlines 110. Alternatively, the first stack material 120 of the patterned first stack material 120" may only be present between the array region 125 and the bitlines 110. While FIG. 6 shows the sidewalls 120c of the first stack material 120 as sloped, the sidewalls 120c may be substantially vertical depending on the etch conditions used to remove the patterned stack 140'. While the pattern of bitlines 110 and spaces 155 is described and illustrated as being formed by the removal of some of the materials of the patterned stack 140', the bitlines 110 and spaces 155 may also be formed by printing the bitlines 110 and spaces 155 by conventional techniques.

The materials of the patterned stack 140' may be removed by conventional techniques, such as by a dry etch process, a wet etch process, or a combination thereof, to form the pattern of bitlines 110 and spaces 155. Conventional etch chemistries (e.g., etch gases, wet etch chemistries) are used to remove the patterned first stack material 120", the patterned second stack material 130', and the patterned third stack material 135' and may be selected based on the materials used for the first stack material 120', the second stack material 130, and the third stack material 135. The wet etch chemistries may include, but are not limited to, hydrogen fluoride (HF), a buffered oxide etch (BOE), or phosphoric acid. One or more etch processes may be conducted to form the pattern of bitlines 110 and spaces 155. For example, a single etch process may be used to form the pattern of bitlines 110 and spaces 155. Alternatively, a first etch process may be used to remove the patterned second stack material 130' and the third stack material 135' and a second etch process may be used to remove the portions of the patterned first stack material 120".

One or more cleaning process may be conducted to remove residual materials of the patterned stack 140' and/or to remove etchant residues (e.g., polymers) formed on the sloped sidewalls 110c of the bitlines 110 during the etch processes. The cleaning process may include conventional chemistries. The oxide material 115 is then formed adjacent to (e.g., over) the pattern of bitlines 110 and spaces 155, forming the air gaps 105 as shown in FIGS. 1 and 2. The oxide material 115 may be a silicon oxide formed from silane or a silane-based precursor. The oxide material 115 may be formed over the bitlines 110, with substantially no oxide material 115 forming within the spaces 155. In other words, the oxide material 115 is not conformally formed (e.g., is subconformally formed). The oxide material 115 may, for example, be formed by a low efficiency process that produces voids. The lower surface 115$b$ of the oxide material 115 proximal to the spaces 155 defines the upper surface 105$a$ of the air gaps 105 while the upper surfaces 125$a$ of the array region 125 define the lower surface 105$b$ of the air gaps 105. The sloped sidewalls 110$c$ of the bitlines 110 and the sidewalls 120$c$ of the first stack material 120 define the sidewalls of the air gaps 105. The oxide material 115 may be formed at a high deposition rate to facilitate forming the air gaps 105. Since the width $W_3$ between the upper portions 110$d$ of the bitlines 110 is narrow, the oxide material 115 does not substantially form within the air gaps 105. The upper surface 105$a$ of the air gaps 105 is higher than (e.g., not coplanar with) the upper surface 110$a$ of the bitlines 110. By subconformally forming the oxide material 115, the height $H_3$ of the upper portion 105$d$ of the air gaps 105 extends above the bitlines 110 and the cross-sectional shape of the upper portion 105$d$ is substantially triangular or substantially semi-circular. For example, the height $H_3$ may be from about 2 nm to about 12 nm, such as from about 5 nm to about 10 nm, above the bitlines 110. The height $H_3$ may be varied within the above range depending on the desired electrical performance properties of the electronic device 100. Without being bound by any theory, it is believed that the sloped sidewalls 110$c$ of the bitlines 110 and the subconformal formation of the oxide material 115 enable the upper portion 105$d$ of the air gaps 105 to be formed above the bitlines 110.

The bitlines 110 and air gaps 105 form a pattern where the height $H_1$ of the air gaps 105 is greater than the height $H_2$ of the bitlines 110. Since the air gaps 105 extend above the height of the bitlines 110, the apparatus including the electronic devices 100 according to embodiments of the disclosure exhibits improved electrical performance compared to apparatus containing conventional electronic devices having air gaps that do not extend above the bitlines. The height $H_1$ of the air gaps 105 is greater than the height of the air gaps in conventional electronic devices since the air gaps in the conventional electronic devices do not extend above the bitlines of the conventional electronic devices. Since the sloped sidewalls 110$c$ of the bitlines 110 according to embodiments of the disclosure are sloped, the height $H_2$ of the bitlines 110 may be maintained relative to the height of the bitlines of conventional electronic devices, which enables the electronic devices 100 to exhibit a resistance that is substantially the same as or improved relative to that of conventional electronic devices. The sloped sidewalls 110$c$ of the bitlines 110 also enable the apparatus including the electronic devices 100 according to embodiments of the disclosure to exhibit a reduced capacitance. By way of example only, the capacitance between adjacent bitlines 110 may be reduced by about 20% relative to the capacitance between adjacent bitlines of conventional electronic devices. By forming the air gaps 105 laterally adjacent to and extending above the bitlines 110, the reduction in capacitance is achieved while maintaining or improving resistance and maintaining the small dimensions of the bitlines 110.

The width $W_1$ of the bitlines 110 according to embodiments of the disclosure is also less than a width of bitlines of the conventional electronic devices, which corresponds to the increased width $W_3$ of the air gaps 105. Therefore, a ratio of the width $W_1$ of the bitlines 110 to the width $W_3$ of the air gaps 105 is less than 1. In other words, a line:space (L:S) ratio of the width of the bitlines 110 to the width of the air gaps 105 is less than 1.0 compared to the L:S ratio of about 1.0 for conventional electronic devices. By way of example only, the L:S ratio may be less than about 0.99, less than about 0.95, less than about 0.92, or less than about 0.90. For instance, the L:S ratio may be between about 0.60 and about 0.99, such as between about 0.60 and about 0.95, between about 0.60 and about 0.92, or between about 0.60 and about 0.90. By forming the openings 145 in which the bitlines 110 are subsequently formed having sloped sidewalls 110$c$, the L:S ratio of the pattern of bitlines 110 and spaces 155 may be less than that of conventional electronic devices formed at substantially the same pitch where the L:S ratio is about 1. The greater height and greater width of the air gaps 105 according to embodiments of the disclosure result in the air gaps 105 having a greater volume than the volume of air gaps in conventional electronic devices for a given pitch, improving the bitline-bitline capacitance.

Accordingly, a method of forming an electronic device is disclosed. The method comprises forming openings in a stack adjacent to an array region, with an upper portion of the openings exhibiting a greater width than a lower portion of the openings. Bitlines are formed in the openings and a portion of the stack is removed to form spaces between adjacent bitlines. An oxide material is formed adjacent to the bitlines and the spaces, the oxide material defining air gaps between the adjacent bitlines.

Accordingly, another method of forming an electronic device is disclosed. The method comprises forming a patterned stack adjacent to an array region, the patterned stack comprising sloped sidewalls that define openings therein. A conductive material is formed in the openings to form bitlines and the patterned stack is removed to form spaces between the bitlines. An oxide material is formed over the bitlines, the oxide material defining air gaps between the bitlines and a height of the air gaps greater than a height of the bitlines.

In contrast to bitlines of conventional electronic devices that have vertical or substantially vertical sidewalls, the bitlines 110 and air gaps 105 of the embodiments of the disclosure exhibit the sloped (e.g., tapered) sidewalls 110$c$, 105$c$. Without being bound by any theory, it is believed that the sloped sidewalls 110$c$ of the bitlines 110 enable the air gaps 105 to be formed and extend above the upper surface 110$a$ of the bitlines 110. The pattern of the bitlines 110 and air gaps 105 may be formed without adding process acts compared to conventional processes of forming electronic devices. In addition, if the formation of the bitlines 110 and air gaps 105 of the disclosure is conducted using a single etch chemistry, additional cost savings are achieved in forming the electronic device 100 containing the bitlines 110 and air gaps 105.

One or more of the electronic devices 100 including the bitlines 110 and air gaps 105 according to embodiments of the disclosure may be present in an apparatus. Additional process acts are conducted to form the apparatus including the one or more electronic devices 100. In the apparatus, the bitlines 110 are operably coupled (e.g., electrically connected) to conductive structures (e.g., contacts, vias) in the array region 125 and above the bitlines 110. The process acts to form the apparatus are conducted by conventional techniques.

Figure 7:
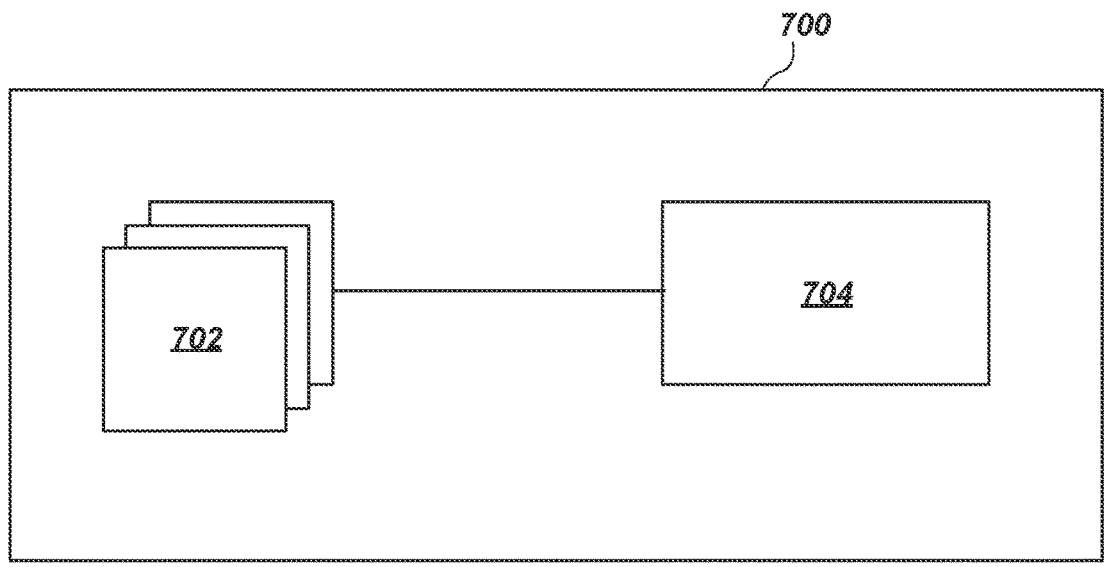
FIG. 7 is a functional block diagram of an apparatus including electronic devices according to embodiments of the disclosure.

The apparatus may include, but is not limited to, a 3D NAND Flash memory device. The 3D NAND Flash memory device may be formed, for example, by a so-called "floating gate" process or a so-called "replacement gate" process. The apparatus including the electronic devices 100 are present in a memory array 700, as shown schematically in FIG. 7, with the memory array 700 including multiple electronic devices 100. The memory array 700 includes an array of memory cells 702 and a control logic component 704. The control logic component 704 may be configured to operatively interact with the array of memory cells 702 so as to read, write, or re-fresh any or all memory cells within the array of memory cells 702. The memory cells of the memory array 700 are coupled (e.g., operably coupled, operably connected) to access lines (e.g., wordlines), and the access lines are coupled to the bitlines 110 (e.g., data lines), which are operably coupled (e.g., electrically connected) to conductive structures above the bitlines 110. A string of memory cells of the memory array 700 is coupled in series between a source line and the bitlines 110, with the memory cells positioned between the access lines and the bitlines 110. Each of the access lines may extend in a first direction and may connect a row of the memory cells. Each of the bitlines 110 may extend in a second direction that is at least substantially perpendicular to the first direction and may connect a column of the memory cells. Additional process acts to form the memory array 700 including the one or more electronic devices 100 are conducted by conventional techniques.

Figure 8:
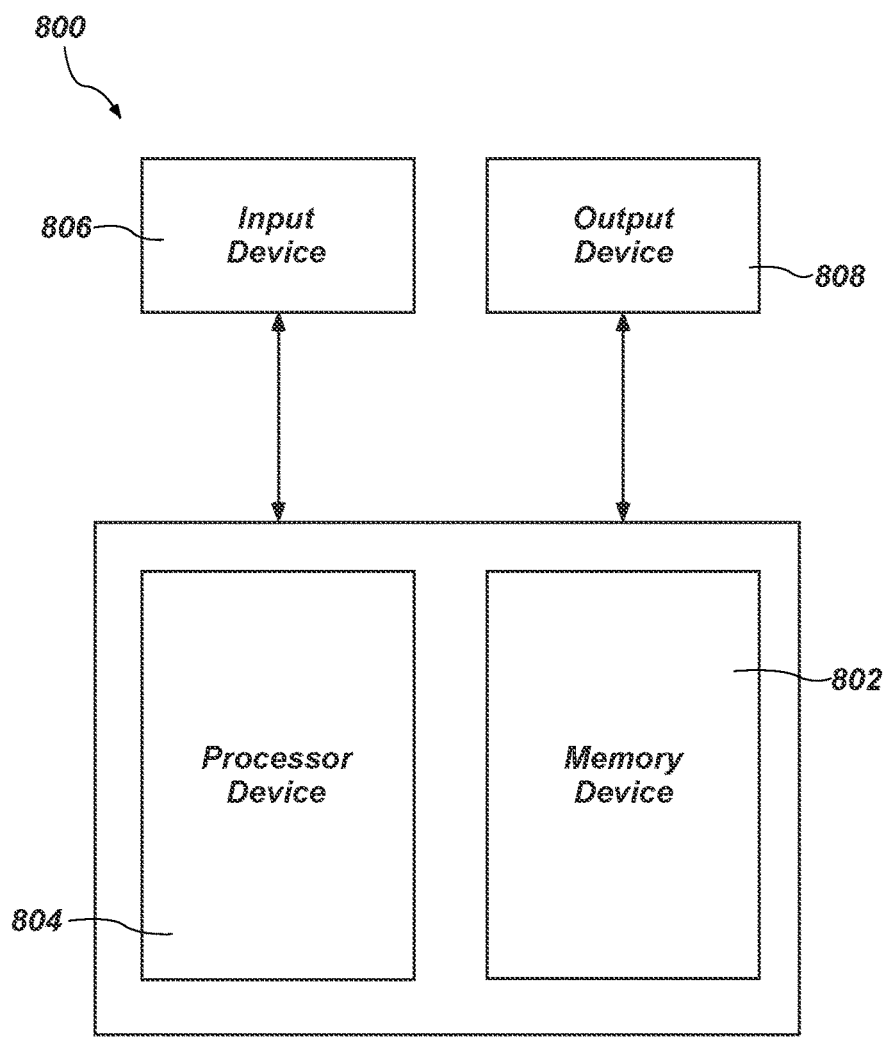
FIG. 8 is a simplified block diagram of a system including electronic devices according to embodiments of the disclosure.

A system 800 (e.g., an electronic system) is also disclosed, as shown in FIG. 8, and includes the one or more electronic devices 100 according to embodiments of the disclosure. FIG. 8 is a simplified block diagram of the system 800 implemented according to one or more embodiments described herein. The system 800 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The system 800 includes at least one memory device 802, which includes one or more of the electronic devices 100 as previously described. The system 800 may further include at least one processor 804, such as a microprocessor, to control the processing of system functions and requests in the system 800. The processor device 804 and other subcomponents of the system 800 may include the memory cells. The processor device 804 may, optionally, include one or more memory arrays 700 as previously described.

Various other devices may be coupled to the processor device 804 depending on the functions that the system 800 performs. For example, an input device 806 may be coupled to the processor device 804 for inputting information into the system 800 by a user, such as, for example, a mouse or other pointing device, a button, a switch, a keyboard, a touchpad, a light pen, a digitizer and stylus, a touch screen, a voice recognition system, a microphone, a control panel, or a combination thereof. An output device 808 for outputting information (e.g., visual or audio output) to a user may also be coupled to the processor device 804. The output device 808 may include an LCD display, an SED display, a CRT display, a DLP display, a plasma display, an OLED display, an LED display, a three-dimensional projection, an audio display, or a combination thereof. The output device 808 may also include a printer, an audio output jack, a speaker, etc. In some embodiments, the input device 806 and the output device 808 may comprise a single touchscreen device that can be used both to input information to the system 800 and to output visual information to a user. The one or more input devices 806 and output devices 808 may communicate electrically with at least one of the memory device 802 and the processor device 804. The at least one memory device 802 and processor device 804 may also be used in a system on chip (SoC).

Accordingly, a system is disclosed. The system comprises a processor operably coupled to an input device and an output device, and an electronic device operably coupled to the processor. The electronic device comprises memory cells in an array region, bitlines coupled to the memory cells, and air gaps laterally adjacent to the bitlines. A height of the air gaps is greater than a height of the bitlines and the air gaps exhibit a pentagonal cross-sectional shape.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. An electronic device comprising:
   bitlines and air gaps adjacent to an array region of an electronic device, the bitlines comprising sloped sidewalls and a height of the air gaps greater than a height of the bitlines; and
   a stack material between the bitlines and the array region.

2. The electronic device of claim 1, wherein a width of an upper portion of the bitlines is greater than a width of a lower portion of the bitlines.

3. The electronic device of claim 1, wherein the air gaps are laterally adjacent to the bitlines, and directly contact the bitlines and an oxide material overlying the bitlines and air gaps.

4. The electronic device of claim 1, wherein a width of the air gaps at a particular location is greater than a width of the bitlines at a corresponding location.

5. The electronic device of claim 1, wherein an upper portion of the air gaps exhibits a triangular cross-sectional shape.

6. The electronic device of claim 1, wherein an upper portion of the air gaps exhibits a semi-circular cross-sectional shape.

7. The electronic device of claim 1, wherein the air gaps exhibit a pentagonal cross-sectional shape.

8. The electronic device of claim 1, wherein the stack material comprises a dielectric material between the bitlines and the array region.

9. An electronic device, comprising:
   a pattern of bitlines and air gaps adjacent to an array region of an electronic device, the air gaps defined by an oxide material overlying the bitlines and air gaps, sloped sidewalls of laterally adjacent bitlines, and an upper surface of the array region, the air gaps extending a distance above the bitlines; and
   a stack material in direct contact with the bitlines and the array region.

10. The electronic device of claim 9, wherein a lower surface of the oxide material defines an upper surface of the air gaps.

11. The electronic device of claim 10, wherein the air gaps extend continuously between the upper surface of the array region and the lower surface of the oxide material.

12. The electronic device of claim 9, wherein the air gaps extend a distance below the bitlines.

13. The electronic device of claim 9, wherein an upper portion of the air gaps is laterally adjacent to the oxide material.

14. The electronic device of claim 9, wherein a ratio of a width of the bitlines to a width of the air gaps is less than 1.

15. A method of forming an electronic device, comprising:
   forming openings in a stack adjacent to an array region, an upper portion of the openings exhibiting a greater width than a lower portion of the openings;
   forming bitlines in the openings, the bitlines comprising sloped sidewalls;
   removing a portion of the stack to form spaces between adjacent bitlines; and
   forming an oxide material adjacent to the bitlines and the spaces, the oxide material defining air gaps between the adjacent bitlines, a height of the air gaps greater than a height of the bitlines, the bitlines and air gaps adjacent to the array region, and a portion of a stack material of the stack between the bitlines and the array region.

16. The method of claim 15, wherein forming openings in a stack adjacent to an array region comprises removing a portion of the stack to form a patterned stack, the patterned stack exhibiting sloped sidewalls.

17. The method of claim 15; wherein forming openings in a stack adjacent to an array region comprises forming the openings in one or more materials of the stack.

18. The method of claim 17, wherein forming the openings in one or more materials of the stack comprises forming sloped sidewalls in two or more materials of the stack.

19. The method of claim 15, wherein forming an oxide material adjacent to the bitlines and the spaces comprises forming the oxide material over the bitlines and the spaces.

20. The method of claim 15, wherein forming an oxide material adjacent to the bitlines and the spaces comprises subconformally forming the oxide material over the bitlines and the spaces.

21. A method of forming an electronic device, comprising:
   forming a patterned stack adjacent to an array region, the patterned stack comprising sloped sidewalk that define openings therein;
   forming a conductive material in the openings to form bitlines comprising sloped sidewalk;
   removing the patterned stack to form spaces between the bitlines a portion of a stack material of the patterned stack in direct contact with the bitlines and the array region; and
   forming an oxide material over the bitlines to define air gaps adjacent to the array region, the air gaps defined by the oxide material overlying the bitlines and air gaps, the sloped sidewalls of laterally adjacent bitlines and an upper surface of the array region a height of the air gaps greater than a height of the bitlines, and the air gaps extending a distance above the bitlines.

22. The method of claim 21, wherein forming a patterned stack comprising sloped sidewalls that define openings therein comprises forming the openings in a stack comprising a first nitride material, an oxide material adjacent to the first nitride material, and a second nitride material adjacent to the oxide material.

23. The method of claim 22, wherein forming a patterned stack comprising sloped sidewalls that define openings therein comprises forming the sloped sidewalls in the first nitride material, the oxide material and the second nitride material.

24. The method of claim 21, wherein forming the air gaps occurs after forming the bitlines.

25. The method of claim 21, wherein forming an oxide material over the bitlines comprises forming the oxide material over the bitlines without forming the oxide material in the spaces.

26. A system, comprising:
   a processor operably coupled to an input device and an output device; and
   an electronic device operably coupled to the processor, the electronic device comprising:
      memory cells in an array region; bitlines coupled to the memory cells, and air gaps laterally adjacent, to the bitlines, a height of the air gaps greater than a height of the bitlines, the air gaps exhibiting a pentagonal cross-sectional shape and a material comprising silicon nitride, silicon oxynitride, or a combination thereof directly contacting the bitlines and the array region.

* * * * *

UNITED STATES PATENT AND TRADEMARK OFFICE
CERTIFICATE OF CORRECTION

PATENT NO.         : 11,508,421 B2
APPLICATION NO.    : 17/097494
DATED              : November 22, 2022
INVENTOR(S)        : Mithun Kumar Ramasahayam and Michael J. Gossman It is certified that error appears in the above-identified patent and that said Letters Patent is hereby corrected as shown below:

In the Claims

| | | | |
|---|---|---|---|
| Claim 17, | Column 15, | Line 27, | change "claim 15;" to --claim 15,-- |
| Claim 21, | Column 15, | Line 43, | change "sloped sidewalk" to --sloped sidewalls-- |
| Claim 21, | Column 16, | Line 2, | change "sloped sidewalk;" to --sloped sidewalls;-- |
| Claim 21, | Column 16, | Line 4, | change "bitlines a" to --bitlines, a-- |
| Claim 21, | Column 16, | Line 10, | change "adjacent bitlines" to --adjacent bitlines,-- |
| Claim 21, | Column 16, | Line 11, | change "region a" to --region, a-- |
| Claim 26, | Column 16, | Line 36, | change "region; bitlines" to --region, bitlines-- |
| Claim 26, | Column 16, | Line 37, | change "adjacent, to" to --adjacent to-- |
| Claim 26, | Column 16, | Line 40, | change "shape and" to --shape, and-- |

Signed and Sealed this
Eleventh Day of April, 2023

*Katherine Kelly Vidal*
Katherine Kelly Vidal
*Director of the United States Patent and Trademark Office*